(12) United States Patent
Dray

(10) Patent No.: US 7,391,661 B2
(45) Date of Patent: Jun. 24, 2008

(54) COLUMN REDUNDANCY SYSTEM FOR AN INTEGRATED CIRCUIT MEMORY

(75) Inventor: Cyrille Dray, Eybens (FR)

(73) Assignee: STMicroelectronics S.A., Montrouge (FR)

( * ) Notice: Subject to any disclaimer, the term of this patent is extended or adjusted under 35 U.S.C. 154(b) by 188 days.

(21) Appl. No.: 11/484,343

(22) Filed: Jul. 11, 2006

(65) Prior Publication Data
US 2007/0033450 A1 Feb. 8, 2007

(30) Foreign Application Priority Data
Jul. 13, 2005 (FR) ................................ 05 07548

(51) Int. Cl.
*G11C 7/02* (2006.01)
(52) U.S. Cl. ................. 365/200; 365/158; 365/185.09; 365/210
(58) Field of Classification Search ................. 365/200, 365/158, 185.09, 210
See application file for complete search history.

(56) References Cited

U.S. PATENT DOCUMENTS 6,064,609 A 5/2000 Jung et al.
6,992,911 B2 * 1/2006 Takahashi ............... 365/145
7,304,899 B2 * 12/2007 Gerstmeier et al. ......... 365/200
2003/0223269 A1 12/2003 Hidaka
2004/0141384 A1 7/2004 Keeth et al.

FOREIGN PATENT DOCUMENTS

EP 1 376 609 1/2004

OTHER PUBLICATIONS

Preliminary French Search Report, FR 05 07548, dated Jun. 2, 2006.

* cited by examiner

*Primary Examiner*—Pho M. Luu
(74) *Attorney, Agent, or Firm*—Gardere Wynne Sewell LLP

(57) ABSTRACT

A memory is organized with many memory subspaces (db$<i>$) each including their own read-out circuit (SA$<i>$). At least one redundant column (Blred) is provided within each subspace in order to compensate for at least one defective column of said subspace. A memory controller is provided for interacting with the memory via a write bus (TD) and a read bus (Q). The memory controller generates a signal (TD$<i>$) for enabling the redundant column. This signal is provided so as to be conveyed to the read-out circuits of the memory to which the write bus (TD) is connected. Thus, one enables, via the read-out circuits, the redundant column of the memory subspaces which are associated with a defective column address.

15 Claims, 4 Drawing Sheets

COLUMN REDUNDANCY SYSTEM FOR AN INTEGRATED CIRCUIT MEMORY

PRIORITY CLAIM

The present application claims priority from French Application for Patent No. 05 07548 filed Jul. 13, 2005, the disclosure of which is hereby incorporated by reference.

BACKGROUND OF THE INVENTION

1. Technical Field of the Invention

The present invention relates to memories made as an integrated circuit and, more particularly, to those which include column redundancy circuits. The invention more particularly, but not exclusively, applies to so-called toggle Magnetoresistance Random Access Memories (MRAM).

2. Description of Related Art

An integrated circuit memory includes many memory cells arranged in rows and columns on a very small surface. Each memory cell is then selectable by a word line associated with each row and a bit line associated with each column.

Methods for manufacturing integrated circuit memories very often introduce defects, notably those which affect the memory cells. Also, in order to avoid a too large number of rejects and with a concern to improve manufacturing yields, the manufacturers of these circuits provide a certain number of so-called redundant cells intended to replace the defective cells of the memory if need be.

In practice, for reasons of simplicity, replacement of a defective memory cell is achieved by replacing the totality of the row or of the column including this cell. The memory element, either row or column, which should be replaced, will depend on the type of detected defect. However, within the scope of the present invention, one is only interested in the redundancy of columns. It is therefore common to associate with the memory scheme, redundancy columns intended to be substituted for columns of the memory plane including one or more defects.

For memories of large capacity intended to provide data as n bit words, provision is made for the number of columns to be much larger than n, and, in this case, the columns are arranged in n subspaces of columns each including p columns of cells. Finally, each column comprises m cells, i.e., the memory includes m rows. By considering the aspect of reading data contained in the memory, each column subspace of the memory will provide one bit of the word at the output of the memory, by collecting at each read-out a datum from a determined column of the relevant subspace. Means for column decoding are then provided for each subspace of the memory, intended to select one column from p columns in the relevant subspace.

Column redundancy means, as at least a replacement bit line, are typically provided within each subspace of the memory, with which means a defective bit line from the p bit lines of the subset may be compensated. The stake then consists of enabling these redundancy means within each subspace at the right moment. More specifically, when a bit line is recognized as defective, the memory should be able to prevent its selection to the benefit of selecting the replacement bit line within the relevant column subspace.

For this purpose, the column redundancy means are put into service as a result of tests carried out before making each integrated circuit, with which all the defective bit lines may be listed. Programmable reconfiguration means are then provided in the memory at each column subspace, so that when the test has revealed a faulty element, the latter is automatically replaced with a replacement element selected from the redundant elements, this replacement should be invisible for the user and without any consequences on the performance of the memory. Thus, for the user, substitution of the columns within the memory should be transparent, i.e., he/she is allowed to send to the input for addressing the memory, an address involving a defective column. In practice, these reconfiguration means apply circuits for detecting whether the current address presented to the memory corresponds to that of a defective column and if this is the case, for selecting a redundant column as a replacement for the faulty column.

This automatic replacement is usually carried out by means of a register provided for locally storing a code of the addresses of the defective columns, downloaded beforehand into the memory. The redundancy columns may then be selected by a circuit for enabling redundancy, which essentially comprises decoding means capable of decoding the code of defective addresses locally stored, and of comparing the addresses of columns received by the memory with the addresses of defective columns decoded beforehand. In the case when a defective column address is applied to the memory, it is therefore recognized by the redundancy enabling circuit, the role of which is then to inhibit the corresponding column decoder and to select a redundancy column as a replacement for the defective column. More specifically, in a given subset of columns of the memory, the defective column is definitively inhibited and the redundancy column is definitively enabled in its place.

This state of the art typically corresponds to the redundancy configuration selected for DRAM type memories, for example. Thus, in this context, and as stated above, the column redundancy means are incorporated inside each subspace of columns of the memory, with however the drawback of having to integrate into the memory specific means for enabling these redundancy means, as an adjunct to standard elements such as read and write circuits and address decoders. These additional means which have to be integrated into the memory for managing redundancy, are formed by the local storage means for the code of addresses of defective columns, and their associated decoding means, which deliver a signal for enabling the redundancy, allowing automatic selection of the associated redundancy column and, in parallel, inhibition of selection of the defective column.

Such an architecture for enabling redundancy means inevitably causes a substantial increase in circuit bulkiness (size or area), not only at the level of the actual memory but also at the level of the peripheral circuitry where the circuit density is already very large. Considering the limited amount of space which is generally available in the integrated circuit memories, it would then be advantageous to be able to omit these additional means in order to activate column redundancy means of the memory.

There is a need in the art to find a remedy to the aforementioned drawbacks. It would be advantageous if, with respect to a column redundancy enabling system in an integrated circuit memory, access to the redundant elements did not require provision of means specifically dedicated for this purpose in the memory.

SUMMARY OF THE INVENTION

With this goal in view, the object of the invention is a redundancy system for an integrated circuit memory organized as a plurality of memory subspaces each comprising their associated read-out circuit, column redundancy means being provided within each subspace in order to compensate for at least one defective column of said subspace, said system comprising a memory controller provided for interacting with said memory via a write bus allowing data to be sent to the memory and a read bus allowing data to be extracted from said memory, said system being characterized in that the memory controller comprises means for generating a signal for enabling column redundancy means, said signal being provided in order to be conveyed to memory read-out circuits to which the write bus is connected, so as to activate via said read-out circuit, the column redundancy means of the memory subspaces comprising a defective column address.

According to one embodiment, as the memory is a MRAM memory of the toggle type where any memory write phase is preceded with a read-out phase, the signal for enabling column redundancy is conveyed from the controller to circuits for reading the memory via the write bus during the read-out phase preceding the memory write phase.

According to this embodiment, the read-out circuits comprise means for locally storing the signal for enabling column redundancy, so as to use said enable signal during the following write phase in order to select column redundancy means in the subspaces comprising a defective column address.

According to another embodiment, the column redundancy enable signal is conveyed from the controller to the memory, in the write mode via the read bus connected to the circuits for reading the memory, said read bus being bi-directional.

Preferably, the means for generating the column redundancy enable signal comprise means for storing address codes of the defective columns of the memory subspaces and means for decoding addresses in order to compare said defective addresses with an address applied to the memory and for delivering said enable signal according to said comparison.

Advantageously, the column redundancy enable signal is formed with a word comprising as many bits as there are memory subspaces, each bit of the enabling word being placed in a first state in order to indicate the necessity of enabling column redundancy means of the corresponding memory subspace and in a second state otherwise.

Preferably, the column redundancy means comprise at least one redundancy bit line.

According to one alternative, the redundancy bit line is a global bit line comprising a so-called even bit line and a so-called uneven bit line.

In an embodiment, a memory circuit comprises a regular bit line, a redundant bit line and a sense amplifier. A regular column select pass transistor is source/drain coupled between the regular bit line and the sense amplifier, and a redundant column select pass transistor is source/drain coupled between the redundant bit line and the sense amplifier. A first column redundancy select pass transistor is source/drain coupled in series with the regular column select pass transistor between the regular bit line and the sense amplifier and is gate driven by a control signal. A second column redundancy select pass transistor is source/drain coupled in series with the redundant column select pass transistor between the redundant bit line and the sense amplifier and is gate driven by a complement of the control signal.

In another embodiment, a memory circuit comprises a plurality of memory subspaces, each memory subspace including a plurality of regular bit lines and at least one redundant bit line, and a read-out circuit for each memory subspace which is coupled to the regular and redundant bit lines of that memory subspace. Each regular bit line further comprises a regular column select pass transistor source/drain coupled between the regular bit line and the read-out circuit, and a first activation pass transistor source/drain coupled in series with the regular column select pass transistor between the regular bit line and the read-out circuit, wherein the first activation pass transistors of a given memory subspace are all gate driven by a control signal. Each redundant bit line further comprises a redundant column select pass transistor source/drain coupled between the redundant bit line and the read-out circuit, and a second activation pass transistor source/drain coupled in series with the redundant column select pass transistor between the redundant bit line and the read-out circuit, wherein the second activation pass transistor of the given memory subspace is gate driven by a complement of the control signal.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
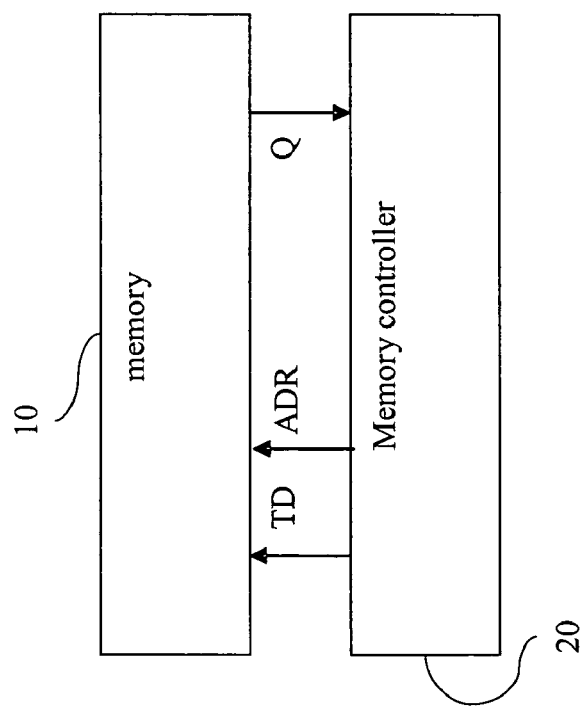
FIG. 1 schematically illustrates the cooperation between a memory and its controller.

Generally, as illustrated in FIG. 1, a memory 10 cooperates with a memory controller 20, interposed between the memory and a processing unit (not shown), provided for managing the activities of the memory and executing the transfer of data between the memory and the outside world. To do this, the memory controller interacts with the memory via a write bus TD and a read bus Q. The write bus is unidirectional, and is provided for conveying data information for writing, from the controller to the memory. Moreover, the read bus Q, also unidirectional, allows the memory controller to recover data from the memory. An address bus ADR is also provided for conveying address information from the controller to the memory.

Figure 2:
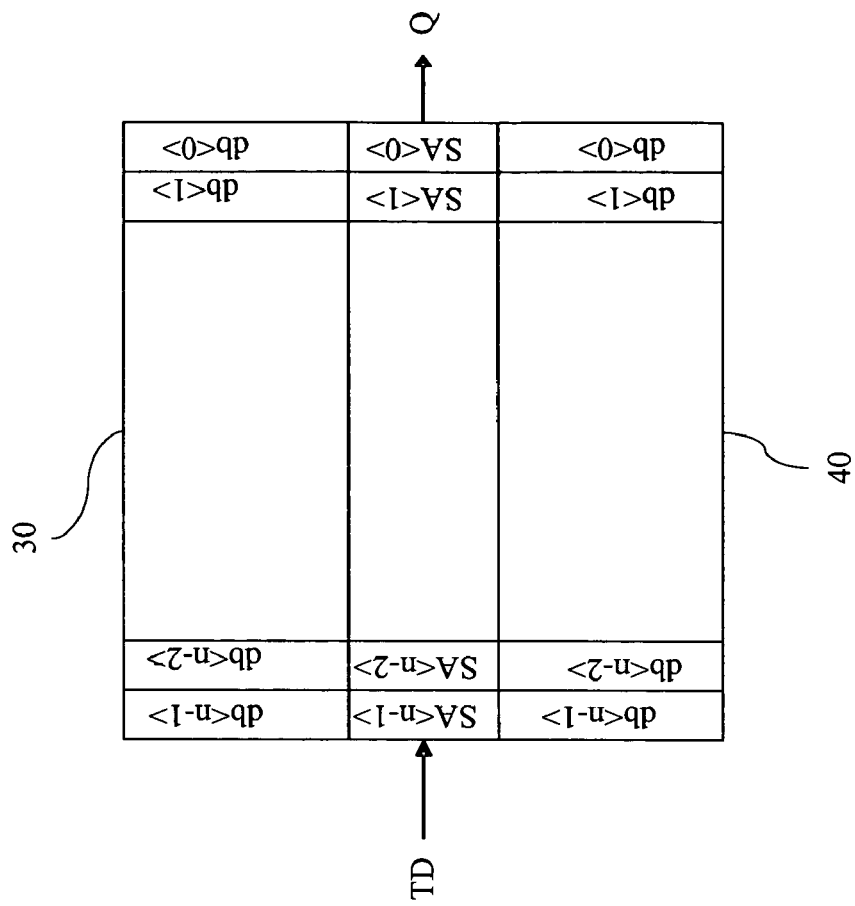
FIG. 2 schematically illustrates the organization of a memory in the context of the present invention.

FIG. 2 represents the general organization of the memory, which will now be more particularly described in reference to a memory architecture of the toggle MRAM type. According to the exemplary embodiment, such a memory is organized in two networks of memory cells, an upper network 30 of cells and a lower network 40 of cells. Each cell network is in fact organized in several memory subspaces, from db<0> to db<n−1>, each providing one bit of the input/output word of the memory. For example, for a 32 bit word, there are 32 memory subspaces.

A set of read-out circuits SA<0> to SA<n−1> (comprising sense amplifiers) is then positioned between both networks of memory cells, each read-out circuit being associated with a subspace of the memory.

Figure 3:
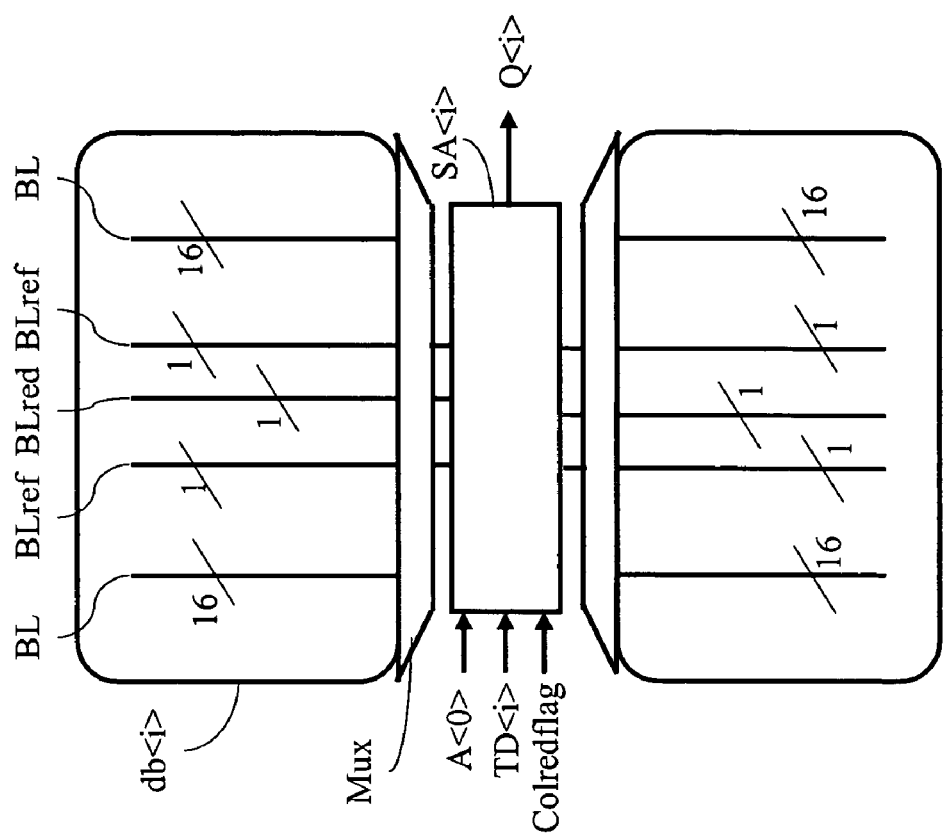
FIG. 3 schematically illustrates the structure of a subspace of the memory illustrated in FIG. 2.

FIG. 3 schematically illustrates the organization of a subspace db<i> of the memory illustrated in FIG. 2, with its associated read-out circuit SA<i>. In this example, the subspace db<i> comprises 32 read bit lines BL. Two reference bit lines Blref are conventionally intended for providing a high and low reference in order to allow read-out.

Moreover, column redundancy means are provided according to the invention within each memory subspace db<i>, as at least one redundancy bit line. As a simple example, FIG. 1 shows a redundancy bit line BLred for the 32 bit lines BL of the memory subspace db<i>.

According to MRAM memories' own specificity, the read/write lines/columns are distinct. Also, although this does not emerge from the schematic illustration of FIG. 3, it should be understood that each column of the memory plane is in fact physically associated with a read bit line and a write bit line. According to the example of FIG. 3, there are consequently 32 read bit lines and 32 write bit lines.

The read-out circuit SA<i> may be connected to one of the read bit lines of the memory subspace db<i> located above the read-out circuit or to one of the read bit lines of the memory subspace db<i> located below the read-out circuit.

To do this, the read-out circuit SA<i> is formed with a read-out amplifier associated with column decoding means, with which a read-out column may be selected from the plurality of columns of the memory subspace db<i> with which the read-out circuit is associated.

With column write circuits which are not illustrated, as for them, the selection of the write bit lines may be controlled within the subspace of the memory, and programming means associated with the write-addressed write bit line within the memory subspace may be controlled.

It is seen that the redundancy bit line BLred provides compensation for a defective bit line from the p bit lines of the memory subspace db<i>, with p=32 in this example. When a column of at least one subspace of the memory is detected as being defective, it is then necessary to designate in its place, the redundancy column of the memory subspace.

To do this, once the defective columns have been listed, the invention provides that the address codes of the defective columns of the different memory subspaces are stored in the memory controller. Thus, when a defective address should be applied to the memory, it is recognized by the memory controller which will control the memory accordingly. The controller is then able to generate a signal for enabling column redundancy means intended for the memory, in order to activate the column redundancy means of the memory subspace(s) comprising a defective column, while inhibiting selection of the defective column of the relevant subspaces.

To do this, the information for enabling column redundancy should be able to be transported to the memory, in order to activate the redundancy bit lines in the memory subspace(s) where a defective column is normally addressed. For this purpose, already existing hardware resources of the memory plane will be used, by taking advantage of the fact that, as it was seen, the read-out circuits are dissociated in part from the write circuits and notably that the read-out circuits SA<i> comprise column decoding means allowing the selection of a column from the plurality of columns in the read-out mode.

Thus, as illustrated in FIG. 2, the write bus TD of the memory is provided for being connected to the read-out circuits SA of the memory, in order to be able to use the write bus for the purpose of conveying the information for enabling column redundancy towards the memory during a read cycle of the latter, when one or more columns need to be repaired.

The system for enabling column redundancy according to the invention then takes advantage of a specificity of so-called toggle MRAM memories, where any phase for writing into a cell of the memory is necessarily preceded with a read phase. Thus, during the read phase which precedes the write phase, the write bus TD which is then free, will be used for enabling the column redundancy means of the relevant memory subspaces.

To do this, as illustrated in FIG. 3, the read-out circuits SA<i> of the subspace db<i> receive the TD<i> signal of the write bus during the read phase, which means that the column redundancy means of this subspace should be enabled.

For example, if the controller detects that the column addressed from the subspace DB<0> is defective, it will send during the read phase a column redundancy enabling word on the write bus TD, by putting all the bits of the word to "0", except for the bit corresponding to the subspace where the defective column is found, which has become "1". In this way, if the bit TD<0> corresponding to the subspace db<0> switches to "1", this means that there is a defective bit line in the memory subspace. Further, by knowing the address which is transmitted to the memory, the address of the defective bit line is known. With the signal TD<0>=1 is sent over the write bus, it is therefore possible to inhibit selection of the defective column in the subspace db<0> to the benefit of selecting the redundancy column. The means for doing this will be more specifically described with reference to FIG. 4 hereafter.

A multiple selection of redundancy columns may also be contemplated within several memory subspaces. Thus, if there is a defective column addressed in several memory subspaces, the controller sets to "1" the corresponding bits of the word transmitted through the write bus TD towards the memory read-out circuits.

Now, the write bus TD has a double function, which is either to convey write information conventionally, or, when the synchronization of the different operations to be carried out on the memory allows this, i.e., during a read-out operation, to convey the information for enabling column redundancy, generated at the controller.

The signal TD<i>, transported from the controller to the memory by using the write bus during the read phase prior to the write operation in the memory, is therefore used as a pointer to the memory subspace db<i> where a column needs to be repaired.

The information for enabling column redundancy is then stored locally by the read-out circuit during a given period of time and may thus be advantageously used during the write phase which follows, for selecting the redundancy column of this subspace without it being necessary to transfer this information again.

Figure 4:
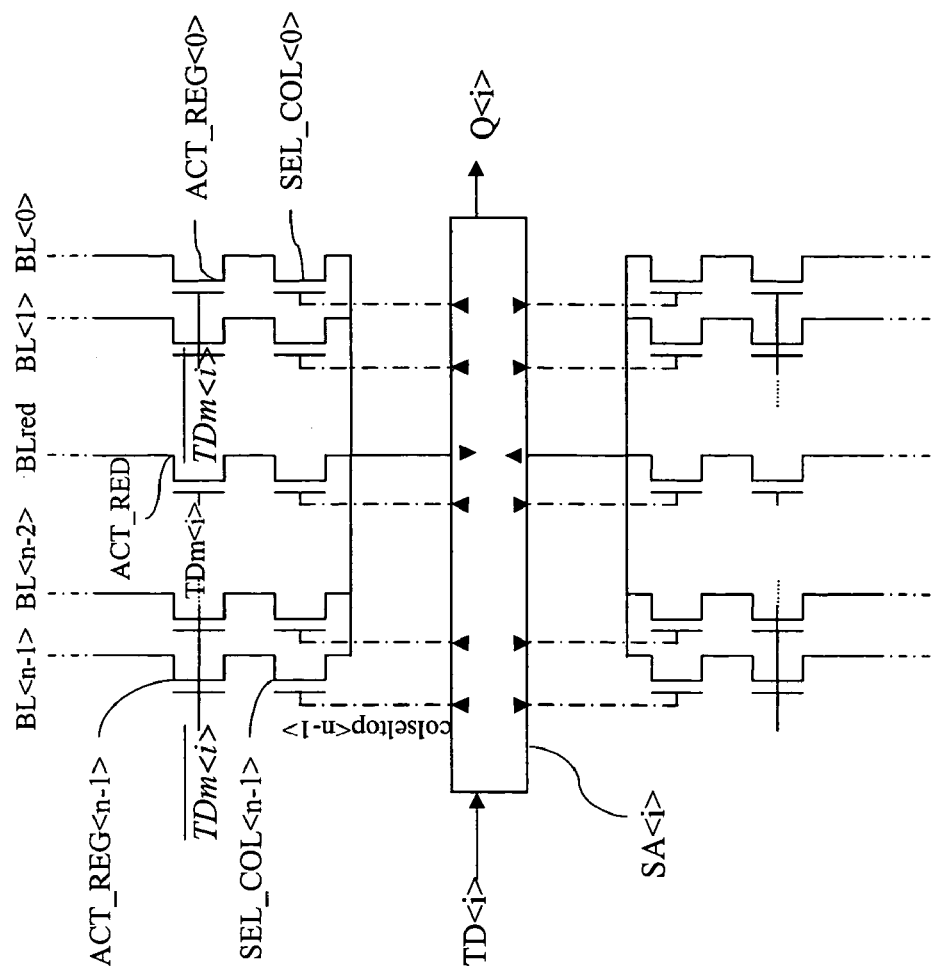
FIG. 4 describes an embodiment illustrating the mechanism for replacing a defective bit line with the benefit of a redundancy bit line by means of the pointer TD<i>.

In order to illustrate the mechanism for replacing a defective bit line with the benefit of a redundancy bit line, FIG. 4 describes an embodiment for applying switching upon reading between the different columns of a memory subspace and the redundancy column, on the basis of the TDm<i> signal, which is the stored version of the signal TD<i>.

FIG. 4 therefore illustrates a memory subspace db<i> with the read-out circuit SA<i> associated with the upper and lower memory plane. Interest is focused more particularly on the upper memory plane, where the start of each bit line BL<0> to BL<n−1>, as well as that of the redundancy bit line BLred are illustrated exclusively. It should be noted that the lower memory plane is perfectly symmetric to the upper memory plane. Each bit line start comprises means for column selection, respectively illustrated by transistors SEL_COL<0> to SEL_COL<n−1>, provided for selecting a column from the n columns of the memory subspace on the basis of address information. These column selection means cooperate with enabling means illustrated by transistors ACT_REG<0> to ACT_REG<n−1> for the normal bit lines and ACT_RED for the redundancy bit line, with which the column redundancy means of the memory subspace may be enabled and disabled on the basis of the stored information TDm<i> for enabling column redundancy.

Thus, the column selection means are controlled by a column decoding signal, colseltop<0> to colseltop<n−1>, provided by the column address decoding means of the read-out circuit SA<i>, on the basis of the address signal corresponding to this memory subspace. In parallel, in the example where the value of the signal TD<i> received on the write bus during the read-out phase indicates the necessity of enabling the column redundancy means of this memory subspace, the transistor ACT_RED associated with the redundancy bit line BLred is enabled by the signal TDm<i> in the logic state "1", whereas transistors, ACT_REG<0> to ACT_REG<n−1>, receive on their gate the complementary signal $\overline{TDm<i>}$, which disables them. In this way, selection of the normally addressed defective bit line is inhibited to the benefit of the selection of the redundancy bit line Blred.

The switching thereby achieved for reading between the normal bit lines and the redundancy bit line according to the value of the signal TDm<i>, may be applied to the write phase similarly.

Further, during the actual write phase, the read bit lines will be able to be used again for conveying the column decoding information to the write circuits. More specifically, one will take advantage of the column decoding means of the read-out circuit SA, providing a column selection signal normally dedicated to read-selecting a column from a plurality of columns, as well as of the metal resource formed by the read bit line, in order to allow write-addressing of the programming means associated with the write bit lines.

Thus, in the case when the column redundancy means of the memory subspace are therefore enabled according to the principles stated earlier, the column decoding information intended for the redundancy write circuits will be able to be conveyed via the redundancy bit line BLred. The decoding information thereby transported by the read bit line then allows the bit write line associated with the redundancy column of the relevant memory subspace to be write-selected. The order for enabling the write redundancy bit line therefore stems from the read-out circuits. The same applies for the addressing of the write bit lines when the column redundancy means are not enabled.

Figure 5:
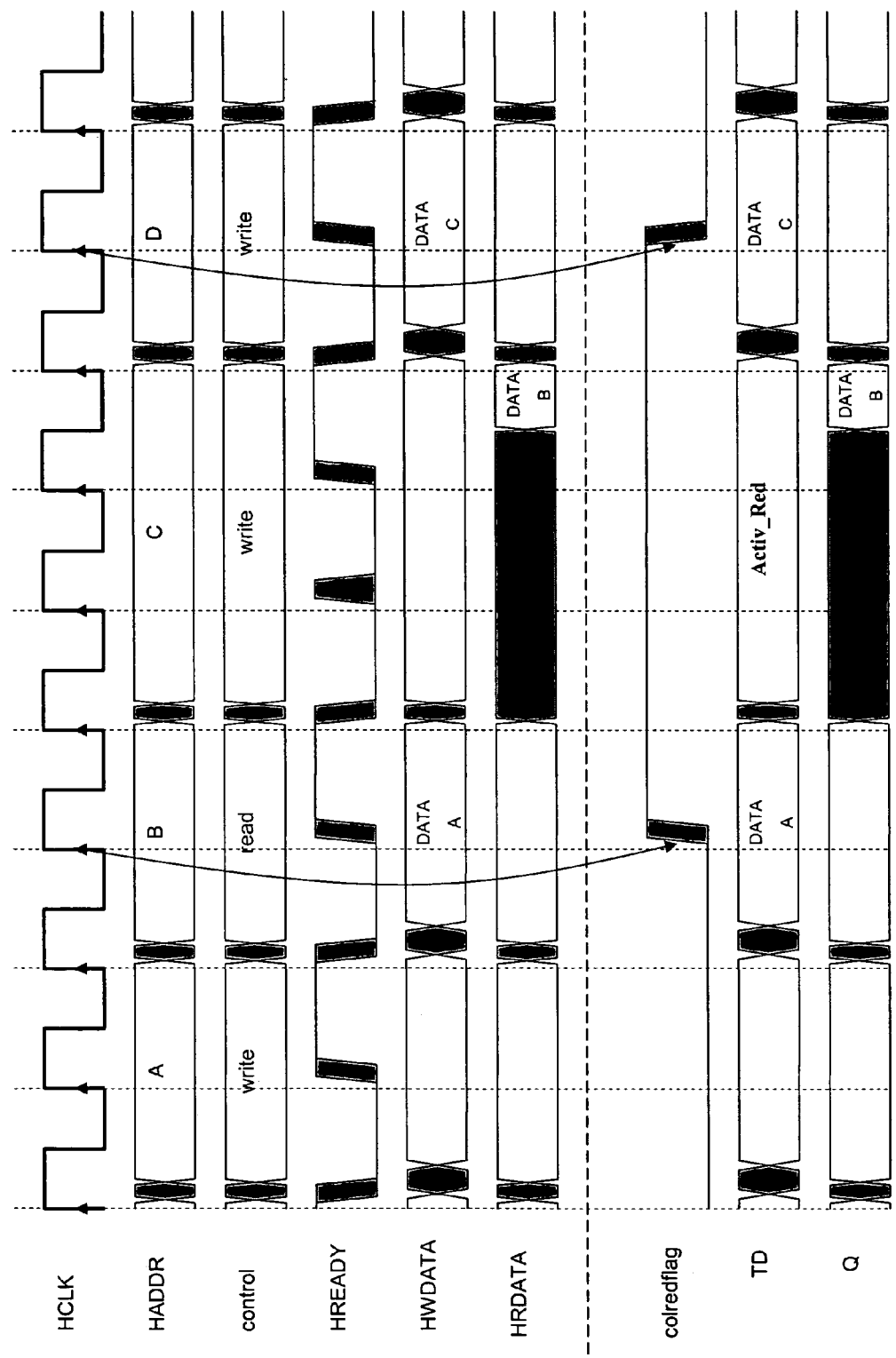
FIG. 5 illustrates time diagrams of different signals illustrating the process for transmitting the information for enabling column redundancy to the memory, according to a particular exemplary embodiment.

FIG. 5 describes a set of timing diagrams illustrating the embodiment of the invention described earlier for enabling column redundancy means in connection with toggle MRAM technology. The signals illustrated above the horizontal dotted line correspond to signals present at the input of the representative controller of the interactions between a user and the memory controller and those located under the line correspond to the signals passed along by the controller to the memory. The signal HCLK corresponds to the clock of the system. The shadowed areas correspond to transition areas of the signals. These signals are given as a simple illustrative example and correspond to the signal exchanged within the framework of the AMBA protocol developed by ARM.

The various actions are taken into account on clock rising edges and their taking into account is conditioned by the HREADY signal, which is a signal controlled by the controller so as to indicate that it is available for receiving and processing data. For example, the third clock rising edge corresponds to a level of "1" of the HREADY signal, with which the information provided to the controller may be taken into account. In this case, the control signal indicates a write action and the address signal HADDR indicates the address symbolized by variable A. The HREADY signal is then set to "0", indicating that the controller is unavailable. The datum DATA A to be written appears on the write data signal HWDATA after the third clock edge. Indeed, according to this protocol, the address and the action to be carried out and then the datum are first presented. This datum DATA A is then sent directly on the TD bus, as illustrated on the lower portion of the figure illustrating the representative signals of the information conveyed on the TD and Q buses of the memory.

Next, at the fifth clock rising edge when the HREADY signal is again "1", with the control and address HDDR signals the controller may be informed of the read action to be carried out at address B. The controller then passes on this action to the memory. After a certain transition time (shadowed area) corresponding to the read access time, the datum DATA B is output on the bus Q and then re-written by the controller on the HRDATA read data bus for the user.

As an illustration of the principle of the invention, upon reading the DATA B datum from the fifth clock pulse, it may be seen that the write bus TD which normally has no reason of being busy, is nevertheless used by the controller for conveying the information for enabling column redundancy Acti_Red during the current read-out phase. This column redundancy information therefore comprises bits TD<i> set to "1" or "0", according to whether the corresponding memory subspace db<i> comprises column redundancy means which should be enabled for subsequent programming.

It is also possible to provide an additional signal called colredflag, emitted from the controller to the memory read-out circuits, as also illustrated in FIG. 3, in order to tell the memory during a read that the column redundancy information conveyed on the bus TD should be taken into account for the current programming address. Indeed, the bus TD, during a memory read phase has always the function of pointing towards memory subspaces for which the column redundancy means need to be enabled. In this case, when there is no need to enable redundancy means, the information conveyed by the bus should be neutral as expressed by setting all the bits of the word Active_Red to "0". Also, with a concern of limiting the consumption of the circuit, instead of switching all the bits of the TD bus to "0", and then switching all or a part of them back to "1" in order to convey an information for enabling column redundancy during a subsequent read phase, one chooses to leave them as they are and to use the global signal colredflag to then indicate whether the information conveyed on this bus during a read-out phase is taken into account. Thus, if the signal colredflag is not enabled, this informs the memory SA read-out circuits that the signal on the TD bus is not to be taken into account and, when it is enabled, the latter is not to be to taken into account.

The embodiment which has just been described, consisting of using the write bus left free during the read phase which precedes the write phase, in order to convey column redundancy enabling information to the relevant memory subspace(s), more specifically relates to MRAM memories of the toggle type.

However, other types of integrated circuit memory do not comprise the specificity of having a write phase necessarily preceded with a memory read-out phase. Thus, for such memories, the write bus is not free in the write mode for conveying the information of column redundancy enabling from the controller to the memory.

According to another embodiment, taking advantage of the memory read-out bus Q may then be contemplated in order to convey the column redundancy enabling information in the write mode, so as to point to the memory subspaces db<i> where the column redundancy means need to be enabled during this phase. The constraint which is to be taken into account is that the read-out bus Q is normally provided so as to be unidirectional, i.e., it is used for outputting data from the memory towards the outside world. To apply this particular embodiment, it is then necessary to provide a bidirectional read-out bus Q, also capable of conveying information from the controller to the memory read-out circuits and more particularly the information of column redundancy enabling. In this case, memories in standard MRAM technology may notably be supported.

In our example where each subspace of the memory comprises a single redundancy column, it is only possible to repair a single bit line among the 32 lines. However, certain memories have the particularity of having bit lines consisting of two bit sub-lines: a so-called even bit line and a so-called uneven bit line. Thus, at the level of the memory, provision is made for conveying parity selection information of the bit line, noted as A<0> in FIG. 3. In this way, a single redundancy bit line is able to replace the even bit line of a given global bit line and the uneven bit line of another global bit line of the memory subspace. In this context, provision may therefore be made for redundancy of two global bit lines, as long as redundancy is applied to bit lines of different parity.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A system, comprising:
   an integrated circuit memory organized in a plurality of memory subspaces each having an associated read-out circuit, with each memory subspace including column redundancy means in order to compensate for at least one defective column within said memory subspace;
   a memory controller which interacts with said integrated circuit memory via a write bus over which data may be sent to the memory, and a read bus over which data may be output from the memory;
   wherein the memory controller comprises means for generating a signal for enabling the column redundancy means, said signal being provided in order to be conveyed to the read-out circuits of the memory to which the write bus is connected, in order to enable, via said read-out circuits, the column redundancy means of the memory subspaces comprising a defective column address.

2. The system according to claim 1, wherein the memory is a toggle type MRAM memory where every memory-write phase is preceded with a read phase, the signal for enabling the column redundancy means being conveyed from the controller to the memory read-out circuits via the write bus during the read phase preceding the memory write phase.

3. The system according to claim 2, wherein the read-out circuits comprise means for locally storing the signal for enabling the column redundancy means so as to use said signal during the subsequent write phase in order to select the column redundancy means in the subspaces comprising a defective column address.

4. The system according to claim 1, wherein the signal for enabling the column redundancy means is conveyed from the controller to the memory, in the write mode, via a read bus connected to the memory read-out circuits, said read bus being directional.

5. The system according to claim 1, wherein the means for generating the signal for enabling the column redundancy means comprises means for storing the address codes of the defective columns of the memory subspaces and means for decoding addresses to compare said defective addresses with an address applied to the memory and for delivering said enable signal according to said comparison.

6. The system according to claim 1, wherein the signal for enabling the column redundancy means is formed with a word comprising as many bits as there are memory subspaces, each bit of the enabling world being set in a first state to indicate the necessity of enabling column redundancy means of the corresponding memory subspace and in a second state otherwise.

7. The system according to claim 1, wherein the column redundancy means comprises at least one redundant bit line.

8. The system according to claim 7, wherein the redundant bit line is a global bit line comprising an even bit line and an uneven bit line.

9. A memory circuit, comprising:
   a regular bit line;
   a redundant bit line;
   a sense amplifier;
   a regular column select pass transistor source/drain coupled between the regular bit line and the sense amplifier;
   a redundant column select pass transistor source/drain coupled between the redundant bit line and the sense amplifier;
   a first column redundancy select pass transistor source/drain coupled in series with the regular column select pass transistor between the regular bit line and the sense amplifier and gate driven by a control signal; and
   a second column redundancy select pass transistor source/drain coupled in series with the redundant column select pass transistor between the redundant bit line and the sense amplifier and gate driven by a complement of the control signal.

10. The circuit of claim 9 wherein the regular column select pass transistor and the redundant column select pass transistor are gate driven by column selection signals output by the sense amplifier.

11. The circuit of claim 10 further comprising a memory controller circuit, wherein the sense amplifier receives a column enable signal from the memory controller circuit.

12. The circuit of claim 11 further comprising a read bus and a write bus coupled to the read-out circuits for the memory subspaces, wherein the control signal/complement is received over the read bus while data to be written to the memory is present on the write bus.

13. A memory circuit, comprising:
 a plurality of memory subspaces, each memory subspace including a plurality of regular bit lines and at least one redundant bit line;
 a read-out circuit for each memory subspace which is coupled to the regular and redundant bit lines of that memory subspace;
 wherein each regular bit line further comprises:
  a regular column select pass transistor source/drain coupled between the regular bit line and the read-out circuit; and
  a first activation pass transistor source/drain coupled in series with the regular column select pass transistor between the regular bit line and the read-out circuit, the first activation pass transistors of a given memory subspace all being gate driven by a control signal; and
 wherein each redundant bit line further comprises:
  a redundant column select pass transistor source/drain coupled between the redundant bit line and the read-out circuit; and
  a second activation pass transistor source/drain coupled in series with the redundant column select pass transistor between the redundant bit line and the read-out circuit, the second activation pass transistor of the given memory subspace being gate driven by a complement of the control signal.

14. The circuit of claim 13 wherein the regular column select pass transistor and the redundant column select pass transistor are gate driven by column selection signals output by the sense amplifier.

15. The circuit of claim 13 wherein the read-out circuits for the memory subspaces temporarily store the control signal/complement received from the read bus for application to the gates of the first and second activation pass transistors.

* * * * *